United States Patent [19]

Mefford

[11] 4,418,332

[45] Nov. 29, 1983

[54] NOISE INSENSITIVE COMPARATOR

[75] Inventor: Joseph P. Mefford, Glen Cove, N.Y.

[73] Assignee: Harris Corporation, Melbourne, Fla.

[21] Appl. No.: 276,967

[22] Filed: Jun. 24, 1981

[51] Int. Cl.³ .................... H03K 5/153; H03K 5/24
[52] U.S. Cl. ............................... 340/146.2; 328/147
[58] Field of Search ............... 340/146.2; 328/147, 328/148

[56] References Cited

U.S. PATENT DOCUMENTS

| | | | |
|---|---|---|---|
| 3,668,532 | 6/1972 | Potash | 328/151 |
| 3,955,102 | 5/1975 | Chi | 307/235 E |
| 4,157,509 | 6/1979 | Zielinski | 328/147 |
| 4,162,454 | 7/1979 | Olsen | 328/147 |

OTHER PUBLICATIONS

Weinberger, "High-Speed Comparators with Offset" IBM Tech. Disclosure Bulletin vol. 23, No. 10, Mar. 1981, pp. 4600-4604.

Primary Examiner—David H. Malzahn
Attorney, Agent, or Firm—Yount & Tarolli

[57] ABSTRACT

A noise insensitive comparator is disclosed which includes an output circuit, such as a bistable flip-flop, which is triggerable to provide an indication and an output control circuit which responds to the first and second signals which are to be compared for triggering the output circuit in accordance therewith. The output control circuit triggers the output circuit to provide the indication when the values of the first and second signals cross over, but only if the first and second signal values have deviated from one another by more than a selected amount since the output circuit was last triggered. This prevents erroneous retriggering of the output circuit due to noise in the first and second signals.

25 Claims, 6 Drawing Figures

NOISE INSENSITIVE COMPARATOR

BACKGROUND AND FIELD OF THE INVENTION

The present invention relates to electrical circuits for comparing the values of two input signals, and more particularly to comparators whose outputs do not exhibit fluctuating output levels in the presence of noise in the input signals.

"Comparators" are circuit elements whose function is to compare the values of two input signals. Although the term is most often used to refer to comparators which compare the amplitudes of two analog input signals, the term is broad enough to encompass also frequency comparators, phase comparators, current comparators, etc. Other types of comparators include those which function in the digital domain rather than in the analog domain, comparing values of two digital input signals. Comparators of these various kinds are basic circuit elements finding extensive use in a large variety of divergent applications.

Although the comparators specifically disclosed herein are of the variety which compare the amplitudes of two analog input signals, it will be appreciated that the techniques and circuits disclosed herein can readily be applied to other forms of comparators, both digital and analog; the invention is therefore not restricted to the specific types of comparators with which it is described in reference to.

Comparators, in general, provide bilevel output signals indicating the relative values of the two input signals supplied thereto. When one of the input signals has a value which is greater than the value of the other input signals, the output has the first value. When the value of the first input signal is less than the value of the second input signal, the output signal has a second value. In many circumstances it is necessary or desirable that the comparator provide unambiguous switching between the first and second output levels as the values of the two input signals approach and cross over. If some noise is associated with one or both of the input signals, however, such noise may cause the relative values of the two input signals to cross over a number of times in rapid succession, producing multiple output transitions where only a single one is desired.

One method utilized in the past to avoid the multiple transitions in the output signals is to provide the comparator with some degree of hysteresis. A hysteresis comparator avoids noise transitions in the output by having different triggering points for positive and negative transitions in the output of the comparator. The two trigger points are selected to be far enough apart that noise in one or both of the input signals does not cause excursions in the relative value of the two signals across both trigger points.

Comparators with hysteresis are not "precise", in the sense that they do not trigger when the values of the two input signals become equal. Instead, there is a small "dead" band centered about the equal relative values wherein on triggering takes place. The existence of this dead band, included to prevent noise triggering of the comparator, is undesirable in those circumstances in which the comparator is intended to provide a precise indication of the relative values of the two input signals.

SUMMARY OF THE INVENTION

It is an object of the present invention to provide an improved comparator circuit which avoids the problems of the prior art.

It is an additional object of the present invention to provide a comparator circuit whose switching characteristics do not exhibit hysteresis, but which yet avoids noise induced switching transients.

It is still another object of the present invention to provide a comparator including a bistable element having an output which is transitioned between its two output levels in accordance with the relative values of the input signals.

In accordance with the present invention, apparatus is provided for comparing the values of first and second signals. The apparatus includes output means which is triggerable to provide an indication, and an output control means responsive to the first and second signals for triggering the output means to provide the indication. The output control means triggers the output means to provide the indication when the values of the first and second signals cross over, but only if the first and second signal values have deviated from one another by more than a selected amount since the output means was last triggered.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

Figure 1A:
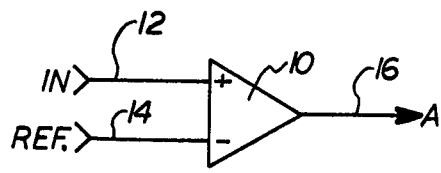
FIGS. 1a and 1b are diagramatic representations of prior art signal comparators.

FIG. 1a is a schematic representation of a prior art comparator without hysteresis. This comparator 10 includes noninverting and inverting inputs 12 and 14, respectively, and an output line 16. The signal provided along the output line 16 is bilevel, having one of two levels dependent upon the relative magnitudes of the signals applied to the two inputs 12 and 14. When the signal applied to the noninverting input 12 is greater in magitude than the signal applied to the inverting input 14, the output signal will be at positive full scale (referred to occasionally hereinafter as a "high" level). When the magnitude of the signal appearing on the inverting input line 14 exceeds the magnitude of the signal appearing on the noninverting input line, however, the output of the comparator will be at negative full scale (referred to occasionally hereinafter as a "low" level). Typically, one of the signals supplied to the two input lines 12 and 14 will be a reference input signal (either a D.C. level or a known waveform) whereas the other will be the input signal whose level is to be compared.

The comparator of FIG. 1a functions quite acceptably in situations in which the input and reference signals have very low noise, since in this situation the point at which the input signal crosses over the reference signal is singular and unambiguous. When, however, the signals appearing on the input lines are corrupted by noise, the transition may be ambiguous; the noise may cause the input signal to vacillate back and forth across the reference signal, causing multiple output transitions where only one was desired.

Figure 2:
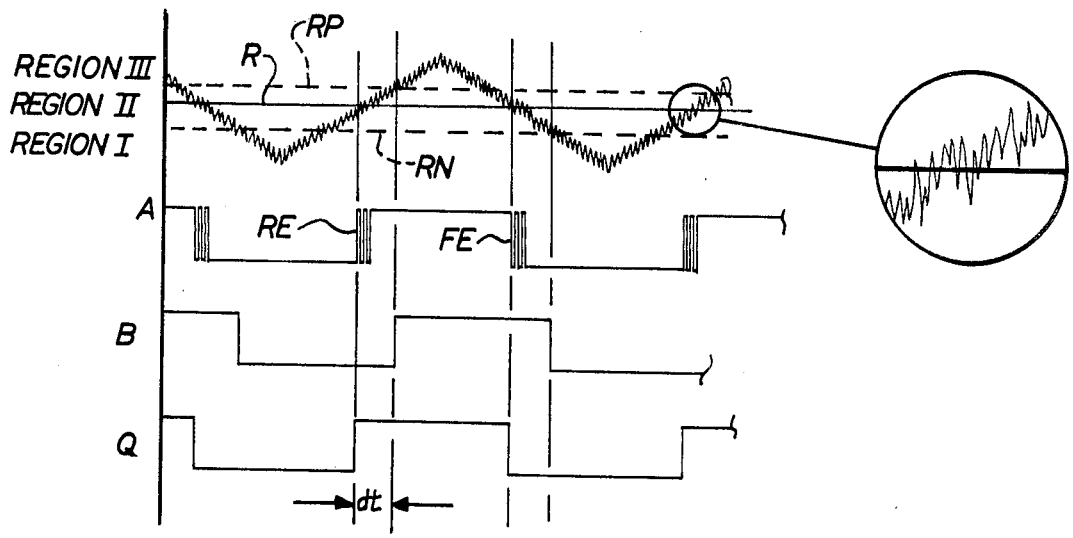
FIG. 2 is a series of waveform diagrams useful in understanding the operation of prior art comparators and also comparators in accordance with the teachings of the present invention.

This can perhaps best be seen in the waveform diagrams of FIG. 2, which indicate the response of the comparator of FIG. 1a under high noise input signal conditions. In the top waveform diagram of FIG. 2 the input signal whose level is being compared is a periodic waveform having a substantially triangular shape, but corrupted by noise. The reference signal with which the input signal is being compared is a constant DC level falling substantially midway between the maximum and minimum levels of the input signal. Were it not for the noise component appearing in the input signal, the output of the comparator would be a rectangular waveform having unambiguous rising and falling edges. Due to the noise component, however, whenever the input signal traverses the reference level it makes multiple departures to either side of the reference signal (see FIG. 2 inset), leading to multiple transitions in the output signal provided by the comparator. These ambiguous output transitions can be disadvantageous in the circuitry which follows the comparator.

Figure 1B:
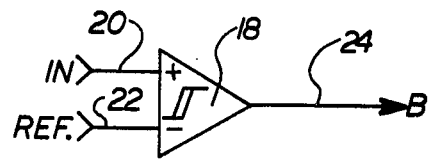

The hysteresis comparator of FIG. 1b, also known in the prior art, avoids these ambiguous output transitions at the expense of accuracy in the comparisons provided thereby. The hysteresis comparator 18 of FIG. 1b again has noninverting and inverting inputs 20 and 22 and a single output line 24. Unlike the FIG. 1a embodiment, however, the transitions in the output signal provided along the output line 4 do not take place exactly when the input and reference signals reach equality, but rather somewhat offset therefrom. Thus, the output waveform provided along the output line 24 will undergo a transition from a low output level to a high output level when the signal appearing at the noninverting input 20 rises above the signal appearing at the inverting input 22 by more than a small offset value dR. After switching to a high level, the output of the comparator will not shift back to a low level until the input signal drops below the reference signal by more than an offset, again equal to the same amount dR.

Thus, the points at which the positive and negative switching of the comparator output occur (identified as RP and RN, respectively, in the drawing) are different from one another and are spaced apart by a separation of two dR. As long as the noise component is smaller than this offset, the noise will not cause the relative values of the two input signals to bridge the gap between the two switching levels, hence only a single output transition will take place. This can again be seen in FIG. 2, where the waveform B represents the output of the hysteresis comparator 18 for the same input and reference signals previously referred to with respect to comparator 10. The output signal B comprises a rectangular waveform having clear and unambiguous rising and falling edges.

It will be noted, however, that the rising and falling edges of the waveform B do not coincide with the points of equality of the input signal and the reference signal applied to the inputs of the comparator. This is a direct result of the offset between the switching points of the comparator used to avoid noise transitions in the output. The greater these offsets, the greater the time delay dt between the output switching and the point of equality of the input in reference waveforms. This time delay can again be disadvantageous in the operation of circuitry which follows the comparator.

In accordance with the present invention, a comparator is provided wherein the rising and falling edges of the output signals provided thereby are unambiguous, and occur at the actual point of equality of the input and reference waveforms.

Figure 3:
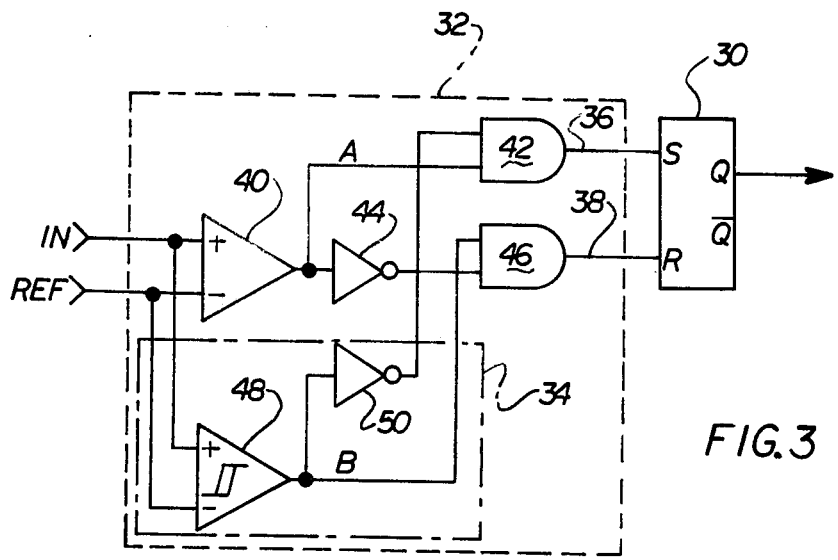
FIG. 3 is a block diagram of one embodiment of a comparator circuit in accordance with the teachings of the present invention.

FIG. 3 is a broad block diagram of one embodiment of the comparator in accordance with teachings of the present invention. In FIG. 3 it can be seen that the comparator generally comprises a bistable logic element 30, and a bistable control circuit 32. The bistable control circuit 32 responds to the two input signals and controls the state of the bistable element 30 in accordance with the relative values of the two input signals. When the input signal exceeds the reference signal, the bistable element 30 is triggered into one state, whereas when the reference signal exceeds the input signal, the bistable element 30 is triggered into the other state. The bistable control circuit 32, however, includes the circuit 34 for preventing the bistable element 30 from being retriggered until after the input signal has deviated from the reference signal by more than a selected amount. This prevents the bistable circuit 30 from being toggled back and forth by vacillations of the input signal in the vicinity of the reference level crossing.

In the specific embodiment illustrated in FIG. 3, the bistable element 30 comprises a set/rest flip flop having SET and RESET inputs 36 and 38, respectively. The flip flop 30 responds to a high logic level signal on its SET input 36 to set the Q output at a high logic level. Similarly, the flip flop 30 responds to a high logic level on its RESET input 38 to reset the signal appearing at the Q output at a low logic level. The SET and RESET inputs to the flip flop 30 are connected to associated outputs 36 and 38 of the bistable control circuit 32. These outputs are derived from the output of a comparator 40. The comparator 40, which lacks hysteresis and therefore is of the prior art variety illustrated in FIG. 1a, responds to the two input signals to provide the output signals used to control flip flop 30. The comparator output is applied to the SET input of flip flop 30 through AND gate 42, and to the RESET input of the flip flop through inverter 44 and AND gate 46.

If the AND gates 42 and 46 were deleted so that the outputs of comparator 40 and inverter 44 were directly connected to the SET and RESET input lines 36 and 38 of the flip flop 30, then the Q output of flip flop 30 would directly follow the output of comparator 40. Each time the output of a comparator 40 went high, a high logic signal would be applied to the SET input whereby the Q output thereof would similarly go high. Conversely, when the output of the comparator 40 went low, the output of logic inverter 44 would go high, thereby applying a high logic signal to the reset input of flip flop 30 and causing the Q output of flip flop 30 to follow the comparator 40 by similarly going low. Thus, any rising edge or falling edge ambiguity occuring in the output of the comparator 40 would similarly occur in the output of the flip flop 30.

The AND gates 42 and 46 prevent this by permitting high logic levels to be applied to only one of the two flip flop inputs at a given time, under control of logic control signals provided by the retrigger preventing circuit 34. At the time that the rising edge pulses RE occur at the output of comparator 40, the retrigger prevent circuit 34 is providing a high logic level signal to AND gate 42 (thereby enabling it) and a low logic level signal to AND gate 46 (thereby disabling it). The output 36 of AND gate 42 will therefore follow the output of the comparator 40. The output 38 of AND gate 46 will remain low, however, regardless of the signal provided thereto by the logic inverter 44. Consequently, the flip flop 30 may be set during this time, but not reset. The first pulse appearing at the rising edge RE of the output of comparator 40 therefore serves to set the flip flop 30, which remains set thereafter.

During the inteveral between the rising edge RE and the falling edge FE, the states of the logic signals provided by the retrigger preventing circuit 34 change whereby the AND gate 46 is enabled and AND gate 42 disabled. The flip flop 30 may therefore be reset, but not set during the period of time overlapping the falling edge FE of the output of comparator 40. Consequently, when the output of comparator 40 first drops low (i.e., when the output of inverter 44 first shifts high) the output of flip flop 30 will be reset and will remain reset throughout the remainder of the falling edge pulses. The output signal provided by the flip flop 30 in response to the input and reference signals shown in FIG. 2, is the waveform Q, also shown in FIG. 2.

The results of the foregoing operation is that the output of the flip flop 30 will shift high with the first pulse of the rising edge RE and will remain high until the first pulse in the falling edge FE of the output of comparator 40, whereafter it will remain low until the first pulse of the next succeeding rising edge. The output of the flip flop 30 is therefore unambiguous, lacking the multiple pulses which did exist in the output of the comparator 40.

The retrigger preventing circuit 34 of the FIG. 3 embodiment comprises a second comparator 48, in this case including hysteresis. The inputs to the comparator 48 are the same as the inputs for the comparator 40 whereby the output of the comparator 48 will have the appearance of the waveform B, shown in FIG. 2. It will be noted that this waveform is displaced from waveform A by a delay dt. The output of the hysteresis comparator 48 is continually low during the pulses occurring on the rising edge RE of the waveform A, and is continually high during the time of occurrence of the pulses of the falling edge FE of the waveform A. This output may therefore be readily used to control the switching of the AND gates 42 and 46. To this end, the output of the comparator 48 is applied directly to the control input of AND gate 46, and is applied to the input of AND gate 42 through a logic inverter 50. The AND gates 42 and 46 will then be enabled and disabled in a fashion described previously.

Figure 4:
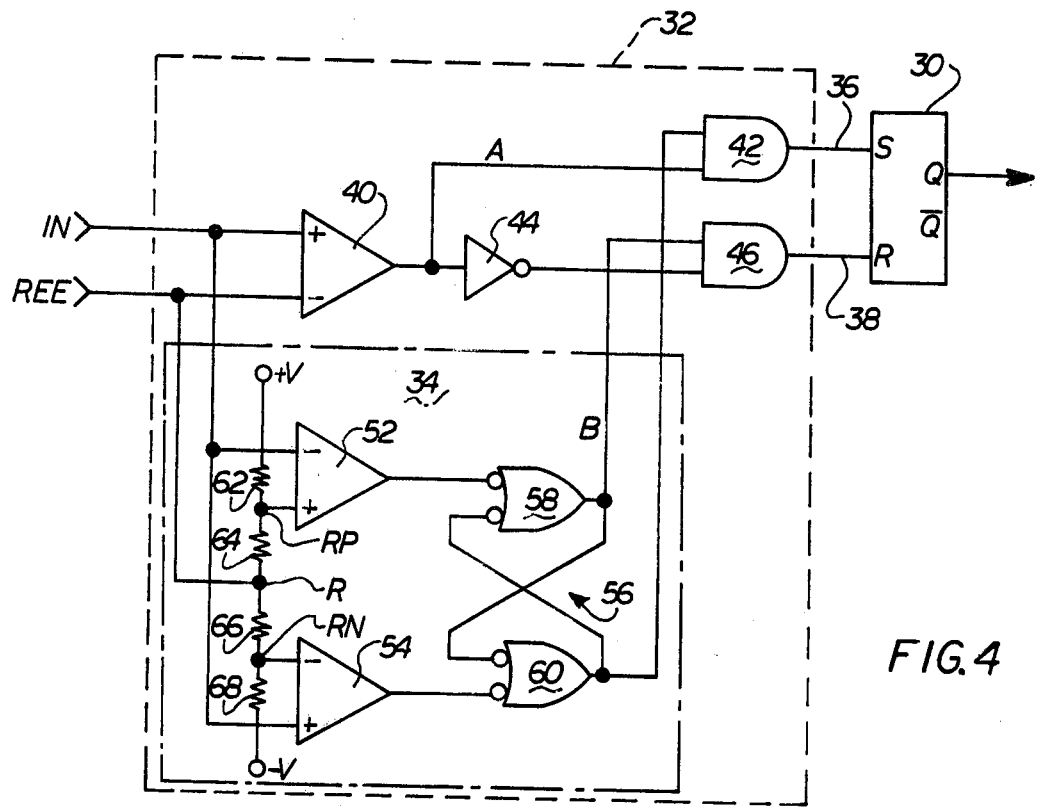
FIG. 4 is a schematic diagram of a second embodiment of a comparator in accordance with the teachings of the present invention.

FIG. 4 is a block diagram of the second embodiment of a comparator in accordance with the teachings of the present invention. For convenience of description, elements of this embodiment which correspond with similar elements of the FIG. 3 embodiment has been numbered correspondingly. The FIG. 4 embodiment is generally similar to the FIG. 3 embodiment, except that the retrigger preventing circuit 34 substitutes two nonhysteresis comparators 52 and 54 for the hysteresis comparator 48 of FIG. 3. The comparator 52 compares the input signal with a signal corresponding to RP (where RP=Ref.+dR), and comparator 54 compares the input signal with the signal corresponding to RN (where RN=Ref−dR). The output signals provided by the two comparators 52 and 54 will depend upon the magnitude of the input signal relative to these two offset reference signals. There are three different cases to be considered: input less than RN (Region I); input between RN and RP (Region II); and input greater than RP (Region III). The output states of the two comparators 52 and 54 in these various cases is summarized in the following table:

|  | Comp. 52 | Comp. 54 |
|---|---|---|
| Region I | High | Low |
| Region II | High | High |
| Region III | Low | High |

The outputs of the two comparators 52 and 54 are connected to the SET and RESET inputs of a flip flop 56, constructed in FIG. 4 by cross-coupling two NAND gates 58 and 60.

The outputs of NAND gates 58 and 60 will be the logic inverses of one another unless both input signals are driven low at the same time. As can be seen from Table I above, this does not occur in this embodiment.

When the input signal passes from Region II into Region III (i.e., when the input signal reaches and exceeds the offset level RP), the output of comparator 52 will drop from a high logic level to a low logic level, usually including a series of pulses introduced by the noise component of the input signal. As soon as the input to flip flop 56 provided by comparator 52 initially drops low, the flip flop 56 will toggle to the state where the output of NAND gate 58 is high and the output of NAND gate 60 is low. The flip flop 56 will remain in this condition until such time as the input signal drops into Region I (i.e., drops below the offset level RN), at which time the output of comparator 54 will drop from a high logic level to a low logic level. This will cause the output of NAND gate 60 to shift to a high logic level and the output of NAND gate 58 to drop to a low logic level. The net result is that the output of the retrigger preventing circuit 34 of FIG. 4 is essentially the same as that shown as waveform B in FIG. 2.

In the FIG. 4 embodiment, the reference signals RP and RN are derived by a voltage divider consisting of four resistors 62, 64, 66 and 68, connected in series between positive and negative DC voltage supplies. The reference signal is applied to the junction between the two middle resistors 64 and 66. The voltage (RP) appearing at the junction between resistor 62 and 64 is therefore somewhat higher than the reference voltage, with its actual magnitude being dependent upon the ratio of resistors 62 and 64. It is this offset level RP which is applied to the noninverting input of comparator 52. Similarly, the voltage (RN) appearing at the junction of resistor 66 and 68 is somewhat lower than the reference voltage, and is applied to the inverting input of comparator 54 as the offset voltage RN.

These offset signals RN and RP could, of course, be derived in a number of other fashions, and the one set forth in FIG. 4 is intended to be merely exemplary. For example, the resistors 64 and 66 could be replaced by respective diodes connected in series, anode to cathode, with the junction therebetween corresponding to the junction between resistors 64 and 66. The offset signals RN and RP would then each be offset from the reference signal by one diode drop. Many other circuits for providing the desired offset reference signals are, of course, possible.

Figure 5:
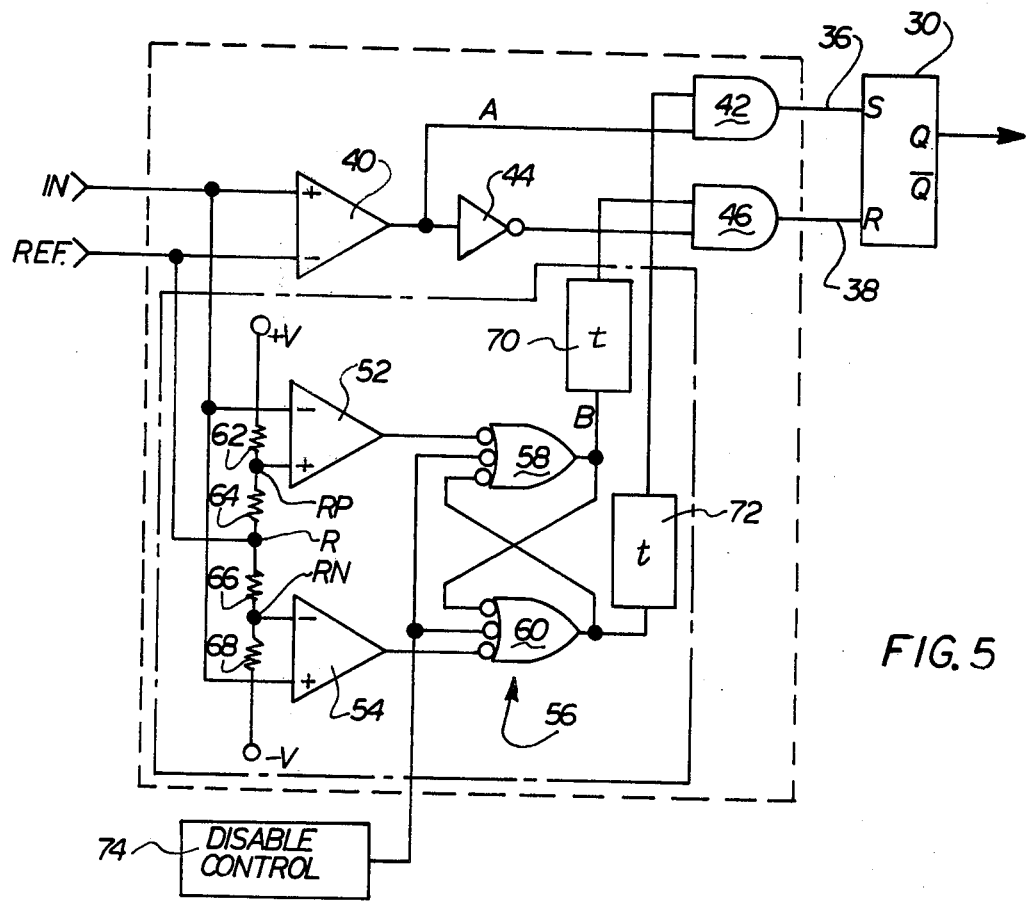
FIG. 5 is a block diagram of a modified FIG. 4 embodiment incorporating two changes to prevent erroneous operation of the comparator during comparison of high speed input signals.

FIG. 5 illustrates an embodiment similar to that of FIG. 4, but modified slightly so as to permit improved operation at high speeds. The embodiments set forth in FIGS. 3 and 4 operate satifactorily, however at very high speeds it it possible that the output of the retrigger preventing circuit 34 would change states before the change in output signal at the output of comparator 40 had an opportunity to set the flip flop 30 into a proper state. As a result, the flip flop 30 would not be correctly switched back and forth in response to variations in the relative values of the two signals provided to the comparator.

More specifically, as the input signal increases in frequency, the time dt (see FIG. 2) between the switching of the comparator 40 and the switching of hysteresis comparator 48 diminishes, thereby also diminishing the time that the gates 42 and 46 are enabled at the rising and falling edges RE and FE of the output of comparator 40. This, in turn, limits the width of the pulses appearing at the SET and RESET inputs of the flip flop 30. For very high frequency input signals, this pulse width may be too narrow to trigger the flip flop 30, resulting in erroneous operation.

To remedy this, the FIG. 5 embodiment is illustrated as incorporating two variations, each adequate by itself to avoid the potential operational limitation outlined above. One method involves the delay of the control signals provided by the retrigger preventing circuit 34 through use of delay circuits 70 and 72, each interposed between an output of one of the NAND gates 58, 60 and the input to the corresponding AND gate 42 and 46. These delay circuits (which may, for example, comprise parallel combinations of resistors and capacitors) delay the control signals provided at the output of the flip flop 56 by a sufficient amount to enable the flip flop 30 to set up in response to the control signals provided thereto by the comparator 40.

An alternative method of accomplishing the same result is to simply disable the retrigger preventing circuit so that both of AND gates 42 and 46 are continually enabled. In this event, the output of the flip flop 30 will directly follow the output of comparator 40. Although this is not desirable at low frequencies due to the "bounce" in the rising and falling edges at the output of comparator 40, at very high frequencies this bounce is either minimal or simply does not exist.

To accomplish this second method, NAND gates 58 and 60 are used having three inputs apiece, rather than two as illustrated in the FIG. 4 embodiment. In FIG. 5, the additional inputs into the NAND gates 58 and 60 are joined together and are controlled by a signal provided by a disabled control circuit 74, which may be either manual or automatic. The disable control circuit 74 normally provides a high logic level signal. This signal has essentially no influence on the operation of the flip flop 56 whereby the operation of the circuit as a whole is substantially as set forth previously. When it is determined (either manually or automatically again) that very high frequencies are being presented for comparison, the disable control circuit 74 provides a low logic level signal. This signal forces the outputs of both NAND gates 58 and 60 to high logic level states. These high logic level signals serve to continually enable both of AND gates 42 and 46.

As stated previously, either method is fully adequate, by itself, to insure proper high frequency operation of the circuit. The two have been incorporated into a single circuit in FIG. 5 solely to simplify description; it is obviously unnecessary to include both the disable control circuit 74 and the delay circuits 70 and 72 in the same circuit.

Of course, the methods disclosed herein for dealing with very high frequency input signals are not intended to be exhaustive. There are a large number of variations of each of the two disclosed methods, as well as a large number of other methods which can accomplish the same or similar results. For example, the delay circuits 70 and 72 may be located instead between the outputs of the comparators 52 and 54 and the inputs of the flip flop 56. Similarly, the gating control function accomplished by the disabled control circuit 74 could readily be accomplished in a large number of other fashions.

Therefore, although the invention has been described with respect to preferred embodiments, it will be appreciated that there are a large number of variations and alterations or parts which may be made without departing from the spirit and scope of the present invention, as defined in the appended claims.

What is claimed is:

1. Apparatus for comparing the values of first and second signals comprising:
output means triggerable to provide an indication; and
output control means responsive to said first and second signals for triggering said output means to provide said indication when the values of said first and second signals cross over, but only if said first and second signal values have deviated from one another by more than a selected amount since said output means was last triggered.

2. Apparatus as set forth in claim 1, wherein said output control means includes means for preventing retriggering of said output means until after said first and second signal values have deviated from one another by an amount which is greater than the expected value of the noise component of said first and second signals.

3. Apparatus as set forth in claim 1, wherein said output means comprises bistable means having first and second states and triggerable to switch between said states, whereby said indication comprises a transition between said states.

4. Apparatus as set forth in claim 3, wherein said output control means comprises means for triggering of said bistable means in only a single direction in response to said signal crossovers and for changing said direction when said signal values deviate from one another by more than said selected amount.

5. Apparatus as set forth in claim 3, wherein said bistable means has a first input for triggering said bistable means into said first state and a second input for triggering said bistable means into said second state and wherein said output control means comprises means responsive to said signal crossovers for providing triggering signals to only one of said inputs and for changing the input to which said triggering signals are applied when said signals deviate from one another by more than said selected amount.

6. Apparatus as set forth in claim 1, wherein said output control means includes retrigger preventing means for preventing said output means from being retriggered by crossovers of said first and second signal values which occur before said first and second signal values have deviated from one another by more than said selected amount.

7. Apparatus as set forth in claim 6 wherein said output control means further comprises comparator means for comparing said first signal to said second signal and providing at least one output signal in accordance with the relative values of said first and second signals for controlling triggering of said output means, and gating means responsive to said retrigger preventing means for controlling the application of said at least one output signal to said output means.

8. Apparatus as set forth in claim 7 wherein said output means is triggerable to first and second states and wherein said comparator means provides a first output signal for controlling triggering of said output means to said first state and a second output signal for controlling triggering of said output means to said second state, and wherein said gating means comprises a first gate for controlling application of said first output signal to said output means and a second gate for controlling application of said second output signal to said output means, said first and second gates being controlled by said retrigger preventing means.

9. Apparatus as set forth in claim 8, wherein said retrigger preventing means includes means for enabling said first gate and disabling said second gate for a first period beginning when said second signal value exceeds said first signal value by more than a first selected amount and ending when said first signal value exceeds said second signal value by more than a second selected amount, whereby said output means can be triggered into said first state only during said first period.

10. Apparatus as set forth in claim 8, wherein said retrigger preventing means includes means for enabling said second gate and disabling said first gate for a second period beginning when said first signal value exceeds said second signal value by more than a selected amount and ending when said second signal value exceeds said first signal value by more than a selected amount, whereby said output means can be triggered into said second state only during said second period.

11. Apparatus as set forth in claim 8, wherein said comparator means comprises a comparator without hysteresis for comparing the levels of said first and second signals to provide a comparator output in accordance therewith, and means responsive to said comparator output for providing said first and second output signals.

12. Apparatus as set forth in claim 11, wherein said means responsive to said comparator output comprises means for providing said comparator output as one of said first and second output signals and for providing the logic inverse of said comparator output as the other of said output signals.

13. Apparatus as set forth in claim 6, wherein said output means is triggerable to first and second states, wherein said retrigger preventing means includes means for providing a bilevel control signal and wherein said output control means further includes means responsive to said bilevel control signal for disabling said output means from being triggered into said second state when said bilevel control signals has a first level, and for disabling said output means from being triggered into said first state when said bilevel control signal has a second level.

14. Apparatus as set forth in claim 13, wherein said bilevel control signal providing means comprises means for switching said bilevel control signal to said first level when said second signal value exceeds said first signal value by more than a selected amount, and for switching said bilevel control signal to said second level when said first signal value exceeds said second signal value by more than a selected amount.

15. Apparatus as set forth in claim 14, wherein said means for switching said bilevel control signal comprises a comparator with hysteresis for comparing the amplitudes of said first and second signal.

16. Apparatus for comparing the values of first and second input signals, comprising:
first comparator means responsive to said first and second input signals for providing a first output signal having one level when the value of said first input signal exceeds the value of said second input signal and another level when the value of said second input signal exceeds the value of said first input signal;
second comparator means also responsive to said first and second input signals for providing a second output signal which is switched to one level when the value of said first input signal exceeds the value of said second input signal by a selected amount and is switched to another level when the value of said second input signal exceeds the value of said first output signal by a selected amount; and
output means responsive to said first and second output signals for providing an indication when said first output signal first changes level after a change of level of said second output signal.

17. Apparatus as set forth in claim 16, wherein said output means includes bistable means having first and second states and triggerable to switch between said states and means for triggering said bistable means each time said first output signal first changes level after a change of level of said second output signal.

18. Apparatus as set forth in claim 17, wherein said bistable means comprises a flip-flop having set and reset inputs, and wherein said means for triggering comprises gating means responsive to said first and second output signals for providing triggering signals to only one of said set and reset inputs when said second output has one level and to only the other of said set and reset inputs when said second output has the other level.

19. Apparatus as set forth in claim 16, wherein said second comparator means comprises a comparator whose switching characteristics exhibit hysteresis.

20. Apparatus as set forth in claim 16, wherein said second comparator means comprises first and second nonhysteresis comparators for respectively comparing the value of one of said input signals with a value which is offset from the value of the other of said input signals by positive and negative selected amounts to provide associated third and fourth output signals, and means responsive to said third and fourth output signals for providing said second output signals.

21. Apparatus for comparing the values of first and second input signals, comprising:
a comparator whose switching characteristics exhibit hysteresis:
a comparator whose switching characteristics do not exhibit hysteresis;
means for coupling the first and second input signals to the inputs of both of said comparators; and
means responsive to the outputs of said comparators to provide an output indication each time the comparator without hysteresis first switches after the comparator with hysteresis switches.

22. Apparatus as set forth in claim 21, wherein said means responsive to the comparator outputs comprises means for providing an output and for changing the level of said output each time the comparator without hysteresis first switches after the comparator with hysteresis switches.

23. A method of comparing first and second input signals, comprising the steps of:
comparing the values of said first and second input signals; and
switching an output signal between two values when said input signal values cross over one another but only if said signal values have first deviated from one another by more than a first amount since the last time the output signal value was switched, whereby multiple input signal value crossovers occurring during a period when said input signal values remain within said first amount of one another will cause only one switching of said output signal.

24. A method as set forth in claim 23, wherein said comparing step includes the steps of:
determining when the values of said input signals have crossed over one another; and
determining when the values of said input signals have deviated from one another by more than a first amount.

25. A method as set forth in claim 23, wherein said switching step includes the steps of:
switching said output signal level when the values of said input signals cross over one another, and
inhibiting further switching of said output signal until after said input signal values have deviated from one another by more than said first amount.

* * * * *